US006803718B2

(12) United States Patent
Wu et al.

(10) Patent No.: US 6,803,718 B2
(45) Date of Patent: Oct. 12, 2004

(54) ORGANIC ELECTROLUMINESCENT DISPLAY DEVICE AND METHOD FOR PACKAGING THE SAME

(75) Inventors: Chao-Chin Wu, Taipei (TW); Meng-Chieh Liao, Hsinchu (TW); Jiun-Haw Lee, Taipei (TW)

(73) Assignee: RiTdisplay Corporation, Hsin Chu (TW)

( * ) Notice: Subject to any disclaimer, the term of this patent is extended or adjusted under 35 U.S.C. 154(b) by 0 days.

(21) Appl. No.: 10/691,576

(22) Filed: Oct. 24, 2003

(65) Prior Publication Data

US 2004/0090187 A1 May 13, 2004

(30) Foreign Application Priority Data

Oct. 25, 2002 (TW) ......................................... 91125345 A (51) Int. Cl.[7] .................................................. G09G 3/10
(52) U.S. Cl. ...................................... 313/500; 313/506
(58) Field of Search ................................. 313/495, 500, 313/504, 506

(56) References Cited

U.S. PATENT DOCUMENTS 6,570,323 B1 * 5/2003 Nakamata et al. ........... 313/500
6,724,143 B2 * 4/2004 Chen et al. ................. 313/512

* cited by examiner

Primary Examiner—David Vu
(74) Attorney, Agent, or Firm—Bacon & Thomas PLLC (57) ABSTRACT

An OLED is disclosed, which has a substrate having a first conducting area, a second conducting area, and an active area; a plurality of connecting wires located outside of said active area on said substrate; a plurality of stripes of first electrodes located in the active area and connected to a connecting wire; a plurality of first conducting lines located in the first conducting area; a plurality of second conducting lines located in said second conducting area; a plurality of second electrodes located in the active area; an upper cover mounted on said active area for covering said active area; a sealing layer sandwiched between said upper cover and said substrate for sealing the active area and isolating said active area from air or water; and an insulating layer filled over said first conducting lines, said second conducting lines, and the connecting wires for isolating from air or water.

20 Claims, 6 Drawing Sheets

ORGANIC ELECTROLUMINESCENT DISPLAY DEVICE AND METHOD FOR PACKAGING THE SAME

BACKGROUND OF THE INVENTION

1. Field of the Invention

The present invention relates to a flat panel display device and, more particularly, to an organic electroluminescent (OEL) display device suitable for displaying various kinds of information and images.

2. Description of Related Art

Organic electroluminescent display devices become focus among various flat panel display devices in recent years because of their advantage of spontaneous emission. In other words, the pixels on the organic electroluminescent display device are capable to display colored images without external backlight modules. Therefore, an organic electroluminescent display device can be a suitable flat panel display device for future applications owing to the advantages of lightweight, compact-size, and thin-thickness.

Generally speaking, the panel of the organic electroluminescent display device is divided into two areas—i.e. an active area and a lead-out area for conducting lines. In most cases, the electrical current is transmitted through the conducting lines to the electrode lines in the active areas. In most current OLED panel, each conducting line is composed of a transparent electrical conducting layer and fine auxiliary metal (e.g., chromium) lines mounted in the layer of transparent electrical conducting layer for increasing the current density therein and simplifying the manufacturing process of the display panel. However, the stacked structure of the conducting lines are easily deteriorated or peeled off due to the damages caused by environmental moisture, oxygen or the frequent driving of electrical currents. As a result, some problems, such as burnout or short circuit occurs frequently in the conducting lines which connect the electrodes in the active area of the conventional electroluminescent display device and the external parts (e.g. ICs). The problems caused from the damages made by moistures, and other electrical factors often lead to unusual deterioration of display qualities. For example, an abnormal bright line (or bands) or an abnormal dark line (or bands) occasionally shows up on the OLED display panel. Moreover, the lifetime of the electroluminescent display device is shortened. Owing to the deterioration of the display quality, the yield for manufacturing OLED is also decreased.

Therefore, it is desirable to provide an organic electroluminescent display device and method for packaging the same to mitigate the aforementioned problems.

SUMMARY OF THE INVENTION

The present invention is to provide an organic electroluminescent display device to reduce or prevent the damage to the conducting lines caused by the environmental moisture and oxygen, to avoid the burnout or short circuit happening to the conducting lines, to improve the display quality, to extend the lifetime of the OLED, to improve the manufacturing yield of display panel, and to reduce the cost of the wasted panels.

The present invention is also to provide a method for packaging an organic electroluminescent display device to reduce or prevent the damage to the conducting lines caused improve the display quality, to extend the lifetime of the OLED, to improve the manufacturing yield of display panel, and to reduce the cost of the wasted panels.

In accordance with the present invention, the organic electroluminescent display device of the present invention comprises: a substrate having a first conducting area, a second conducting area, and an active area; wherein said active area locates adjacent to said first conducting area and said second conducting area; a plurality of connecting wires, which do not connect with each other and are located outside said active area on said substrate; a plurality of stripes of first electrodes located in said active area, wherein said first electrodes connect to said connecting wires; a plurality of first conducting lines, which do not connect with each other and are located in said first conducting area on said substrate; a plurality of second conducting lines, which do not connect with each other and are located in said second conducting area on said substrate; a plurality of second electrodes located in said active area, wherein each of said second electrodes connects a first conducting line or a second conducting line; at least one organic electroluminescent medium located in said active area, wherein said organic electroluminescent medium is sandwiched between said first electrode and said second electrode; an upper cover mounted over or on said active area of said substrate for covering said active area; a sealing layer sandwiched between said upper cover and said substrate for sealing, surrounding said active area, and isolating said active area from air or moisture; and an insulating layer filled over said first conducting lines, said second conducting lines, and said connecting wires for isolating said first conducting lines, said second conducting lines, and said connecting wires from air or water; wherein part of each first electrodes, each first conducting lines, each second conducting lines, and each connecting wires has at least one auxiliary metal layer and one transparent electrical conducting layer, and said transparent electrical conducting layer is sandwiched between said auxiliary metal layer and said substrate.

The panel for an organic electroluminescent display device of the present invention includes: a substrate having a first conducting area, a second conducting area, and an active area; wherein said active area locates adjacent to said first conducting area and said second conducting area; a plurality of connecting wires located outside said active area on said substrate, wherein said connecting wires do not connect with each other; a plurality of stripes of first electrodes located in said active area, wherein said first electrodes connect to said connecting wires; a plurality of first conducting lines located in said first conducting area on said substrate and do not connect with each other; and a plurality of second conducting lines located in said second conducting area on said substrate and do not connect with each other; wherein each first conducting line, each second conducting line, and each connecting wire in said active area has at least one transparent electrical conducting layer and optionally an auxiliary metal layer, said transparent electrical conducting layer is sandwiched between said auxiliary metal layer and said substrate; and no auxiliary metal layer exists in each first conducting lines, each second conducting lines, and each connecting wires outside said active area.

The organic electroluminescent display device of the present invention includes: a substrate having a first conducting area, a second conducting area, and an active area; wherein said active area locates adjacent to said first conducting area and said second conducting area; a plurality of connecting wires located outside said active area on said substrate, wherein said connecting wires do not connect with each other; a plurality of stripes of first electrodes located in said active area, wherein said first electrodes connect to said connecting wires; a plurality of first conducting lines located in said first conducting area on said substrate and do not connect with each other; a plurality of second conducting lines located in said second conducting area on said substrate and do not connect with each other; an upper cover mounted over or on said active area of said substrate for covering said active area; and a sealing layer sandwiched between said upper cover and said substrate for sealing, surrounding said active area, and isolating said active area from air or moisture; wherein each first conducting line, each second conducting line, and each connecting wire in said active area has at least one transparent electrical conducting layer and optionally an auxiliary metal layer, said transparent electrical conducting layer is sandwiched between said auxiliary metal layer and said substrate; and no auxiliary metal layer exists in each first conducting lines, each second conducting lines, and each connecting wires outside said active area.

The method for manufacturing an organic electroluminescent display device of the present invention comprises the following steps: (A) forming an active area, a plurality of stripes of first electrodes, a plurality of connecting wires, a plurality of first conducting lines, and a plurality of second conducting lines on a substrate; wherein said first electrodes are located in said active area of said substrate, and each of said first electrodes connects to one of said connecting wires; said first conducting lines are located outside said active area on said substrate and do not cross with each other; said second conducting lines are located outside of said active area on said substrate and do not cross with each other; and part of each first electrode, each first conducting line, each second conducting line, and each connecting wire has at least one auxiliary metal layer and one transparent electrical conducting layer, and said transparent electrical conducting layer is sandwiched between said auxiliary metal layer and said substrate; (B) forming at least one organic electroluminescent medium and a plurality of stripes of second electrodes in said active area, and forming an insulating layer on parts of said first conducting lines, said second conducting lines, and said connecting wires outside of said active area for insulating from air or moisture; wherein at least said a plurality of second electrodes and said organic electroluminescent medium are located in said active area of said substrate, said organic electroluminescent medium is sandwiched between said second electrodes and said first electrodes, each of said first electrodes do not directly connect to said second electrodes, and each of said second electrodes connects to one of said first conducting lines or one of said second conducting lines; and (C) covering an upper cover on said active area and forming a sealing layer between said upper cover and said substrate; wherein said first conducting lines, said second conducting lines, and said connecting wires located outside of said sealing layer are covered by said insulating layer.

The method for manufacturing an organic electroluminescent display device of the present invention includes the following steps: (A) forming a plurality of stripes of first electrodes, a plurality of connecting wires, a plurality of first conducting lines, and a plurality of second conducting lines on a substrate having an active area, a first conducting area, and a second conducting area; wherein said active area locates adjacent to said first conducting area and said second conducting area, said connecting wires located outside said active area on said substrate; said first electrodes are located in said active area of said substrate, each of said first electrodes connects to one of said connecting wires; said first conducting lines are located outside said active area on said substrate and do not cross with each other; said second conducting lines are located outside said active area on said substrate and do not cross with each other; each first conducting line, each second conducting line, and each connecting wire in said active area has at least one transparent electrical conducting layer and optionally an auxiliary metal layer, said transparent electrical conducting layer is sandwiched between said auxiliary metal layer and said substrate; and no auxiliary metal layer exists in each first conducting lines, each second conducting lines, and each connecting wires outside said active area; (B) forming at least one organic electroluminescent medium and a plurality of stripes of second electrodes in said active area; wherein at least said second electrodes and said organic electroluminescent medium are located in said active area of said substrate, said organic electroluminescent medium is sandwiched between said second electrodes and said first electrodes, each of said first electrodes do not directly connect to said second electrodes, and each of said second electrodes connects to one of said first conducting lines or one of said second conducting lines; and (C) covering and binding an upper cover on said active area and forming a sealing layer between said upper cover and said substrate; wherein said first conducting lines, said second conducting lines, and said connecting wires located outside said sealing layer do not have said auxiliary metal layer.

The display driving mechanism of the active area of the organic electroluminescent display device of the present invention can be any conventional display driving mechanism. Preferably, the display driving mechanism of the active area is passive or active. The relative position of the first conducting area and the second conducting area to the active area of the organic electroluminescent display device of the present invention is not restricted. Preferably, the distribution of the conductive lines is X-Y matrix distribution surrounding the active area, bilaterally top-bottom distribution surrounding the active area, or symmetrically left-right distribution surrounding the active area. The active area is located adjacent to the first conducting area and the second conducting area. Preferably, the active area is located between the first conducting area and the second conducting area. The numbers of the first conducting lines and the second conducting lines of the present invention are not limited. Preferably, the number of the first conducting lines and that of the second conducting lines are the same. The first electrodes, the first conducting lines, the second conducting lines, and the connecting wires of the organic electroluminescent display device of the present invention have transparent electrical conducting layers for conducting the electrical signals. Optionally, they also have auxiliary metal layers for increasing the electrical conductivity. The materials of the auxiliary electrodes of the first electrodes, the first conducting lines, and the second conducting lines can be any conventional conductive materials. Preferably, the auxiliary electrodes of the first electrodes, the first conducting lines, and the second conducting lines are made of aluminum (Al), chromium (Cr), or silver (Ag) alloys. In addition, the active area of the organic electroluminescent display device of the present invention can optionally include a plurality of isolating walls located between the second electrodes in the active area or selectively on the first electrodes. A plurality of pixel-defining layers is preferably formed in the active area for insulating and defining the areas of the organic electroluminescent media. The materials of the pixel-defining layer can be any conventional material for shading light or insulating electrical currents. Preferably, the pixel-defining layer is made of polyimide. The materials of the first electrodes can be any conductive materials. Preferably, the first electrodes are made of transparent conductive materials. More preferably, the transparent materials are selected from $InSnO_3$, $SnO_2$, ZnO-doped $In_2O_3$, CdSnO, or antimony. The materials of second electrodes can be any electrically conductive material. Preferably, the second electrodes are made of aluminum, diamond, diamond like carbon (DLC), calcium, aluminum-silver alloy, or magnesium-silver alloy. The arrangement of the first electrodes is not restricted, and is preferred to be parallel to each other. The arrangement of the second electrodes is not restricted, and is preferred to be parallel to each other. The method for manufacturing an organic electroluminescent display device of the present invention can be achieved by optionally form a pixel-defining layer before the formation of the organic electroluminescent medium and the second electrodes in the active area are completed. In other words, a plurality of pixel-defining layers are formed first on the substrate for insulating and defining the areas of the organic electroluminescent media, wherein each of the pixel-defining layers is located between the adjacent organic electroluminescent media on the substrate or on the first electrodes. The method for manufacturing an organic electroluminescent display device of the present invention also includes the step of optionally forming a plurality of isolating walls before forming the organic electroluminescent medium and the second electrodes in the active area. The isolating walls are located between the adjacent second electrodes on the substrate or the first electrodes. The organic electroluminescent medium of the present invention can be made of the small organic molecules or polymers. Furthermore, the organic electroluminescent medium can optionally include an electron injecting layer, an electron transporting layer, a hole transporting layer, and a hole injecting layer. The active area can be further sealed with an upper cover for preventing moisture, or any sensitive chemical pollutants (e.g. oxygen, oxide, or sulfide in the air). Moreover, the external integrated circuit chips can be bonded on the substrate through COG (chip on glass) bonding. The materials of the insulating layers of the present invention could be made of any known organic or inorganic material that is capable of insulating moisture or oxygen. Preferably, the insulating layer is made of $SiO_2$, $TiO_2$, silicon nitride, epoxy resin, unsaturated polyester resin, Teflon™ resin, phenolic resin, or polyimide. The method for forming the insulating layer can be any conventional method. Preferably, the insulating layer is formed through evaporation, sputtering, immersion plating, or spraying.

In one aspect, the organic electroluminescent display device and method for packaging the same of the present invention prevents the first conducting lines, the second conducting lines, and the auxiliary metal layers of the connecting wires outside the sealing layer from corroding by the moisture or oxygen through covering an insulating layer on the first conducting lines, the second conducting lines, and the auxiliary metal layers of the connecting wires so that the display quality can be improved and the lifetime of the OLED display device can be extended. The method for covering the insulating layer on the first conducting lines, the second conducting lines, and the auxiliary metal layers of the connecting wires can be any conventional method. Preferably, the insulating layer is covered on the first conducting lines, the second conducting lines, and the auxiliary metal layers of the connecting wires by coating, evaporation, or sputtering.

In another aspect, the organic electroluminescent display device and method for packaging the same of the present invention prevents the first conducting lines, the second conducting lines, and the connecting wires from corroding by the moisture or oxygen through peeling off the auxiliary metal layers of the first conducting lines, the second conducting lines, and the connecting wires outside the sealing layer. As a result, only the transparent electrical conducting layers of the first conducting lines, the second conducting lines, and the connecting wires outside the sealing layer are left, the display quality can therefore be improved, and the lifetime of the OLED display device can be extended. The organic electroluminescent display device of the present invention may peel off the auxiliary metal layers of the predetermined parts of the first conducting lines, the second conducting lines, and the connecting wires by etching. Hence, the first conducting lines, the second conducting lines, and the connecting wires are prevented from corroding by the moisture or oxygen successfully, and then the display quality of the OLED display device can be improved and the lifetime of the OLED display device can be extended.

The aforesaid organic electroluminescent display device can be applied to any purpose or apparatus for displaying images, graphics, characters and texts; and preferably, to televisions, computers, information display device of printers, monitors, information display devices of vehicles, the displays of signal machines, information display devices of communication apparatus (such as cell phones, telephones), information display devices of telephones, interactive electronic books, micro-displays, displays of fishing devices, personal digital assistants (PDAs), virtual reality game means, information display devices of simulative flying training, displays of airplane equipment, and displays of visors for video games.

Other objects, advantages, and novel features of the invention will become more apparent from the following detailed description when taken in conjunction with the accompanying drawings.

DETAILED DESCRIPTION OF THE PREFERRED EMBODIMENT

Embodiment 1

Figure 1A:
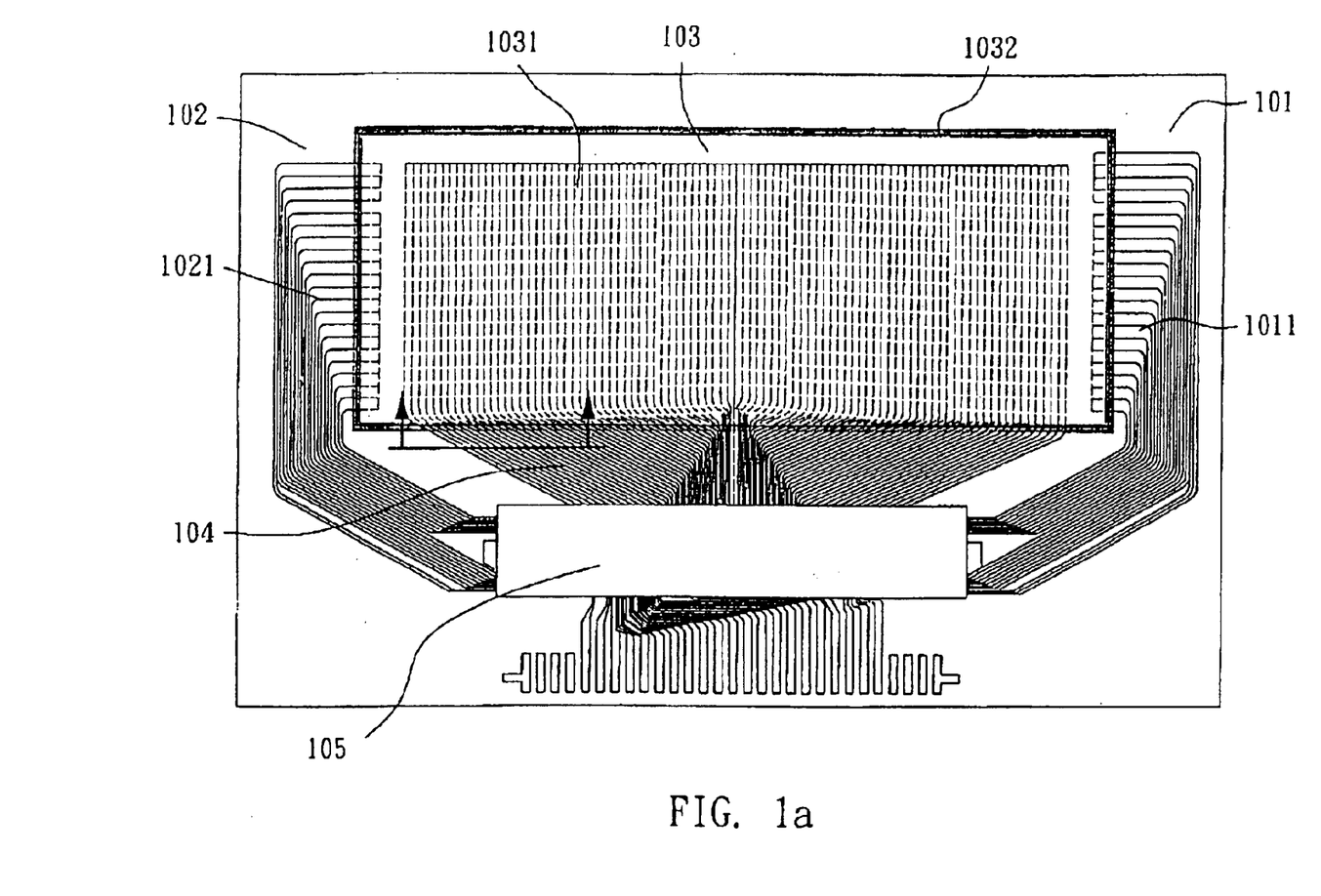
FIG. 1*a* is a top view of the OEL display device with a sealing layer of a first preferred embodiment of the present invention.
Figure 1B:
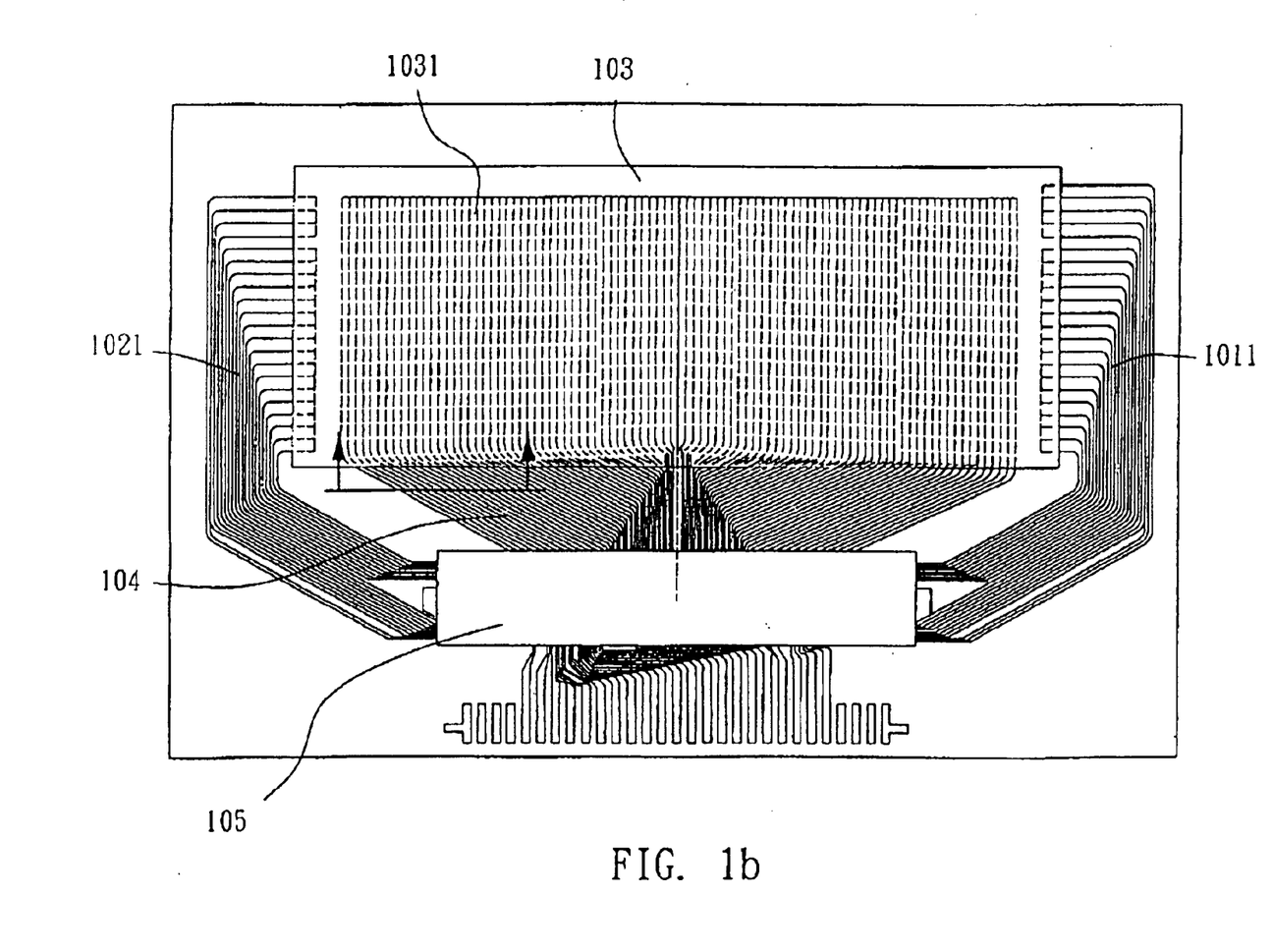
FIG. 1*b* is a top view of the OEL display device without the sealing layer of the first preferred embodiment of the present invention.

With reference to FIGS. 1*a* and 1*b,* there are shown top views of the electroluminescent display device of the present invention. For the convenience of illustration, the upper cover located over the substrate is not shown in FIGS. 1*a* and 1*b.* Further, the panel of the electroluminescent display device of the present invention is divided into at least three areas (i.e. two conducting areas which includes the first conducting area 101, the second conducting area 102, as well as the active area 103). With regarding to the driving mechanism, the display driving mechanism of the active area 103 can be any conventional display driving mechanism (e.g. passive or active). In the present embodiment, the display driving mechanism of the active area 103 is passive electroluminescent display driving mechanism. Respectively, there are the first conducting lines 1011 and the second conducting lines 1021 in the first conducting area 101 and the second conducting area 102. In the present embodiment, the first conducting lines 1011 are disposed symmetrically on the substrate of the OLED panel with respect to the second conducting lines 1021. The active area 103 is placed in between the first conducting lines 1011 and the second conducting lines 1021 contiguously. The first conducting lines 1011 and the second conducting lines 1021 serve to connect the electrodes in the active area 103 and the corresponding pins of the integrated circuit 105 or other connecting lines, such as the terminals of a bus. The first conducting lines 1011 and the second conducting lines 1021 on the substrate do not connect with each other. The first conducting lines 1011 on the substrate are arranged in parallel and are arranged in a shape of "L" in the first conducting area 101. The second conducting lines 1021 on the substrate are also in parallel and are arranged in a shape of "L" in the second conducting area 102. Additionally, the number of the first conducting lines 1011 in the first conducting area 101 is equal to that of the second conducting lines 1021 in the second conducting area 102. Below the active area 103, there are parallel connecting wires 104 for connecting the electrodes in the active area 103. In the present embodiment, the connecting wires 104 connect to the first electrodes 1031 (the anodes) in the active area 103, as well as the corresponding pins of the integrated circuit 105 or other connecting lines, such as the terminals of a bus. With referring to FIGS. 3a to 3c, each of the first electrodes 1031 is a combination of a transparent electrical conducting layer and an auxiliary metal line. In the present embodiment, the first electrodes 1031 are made of indium tin oxide (ITO). On the first electrodes 1031, there are stripes of auxiliary metal lines 1038 made of silver alloy for increasing the current density.

Figure 4:
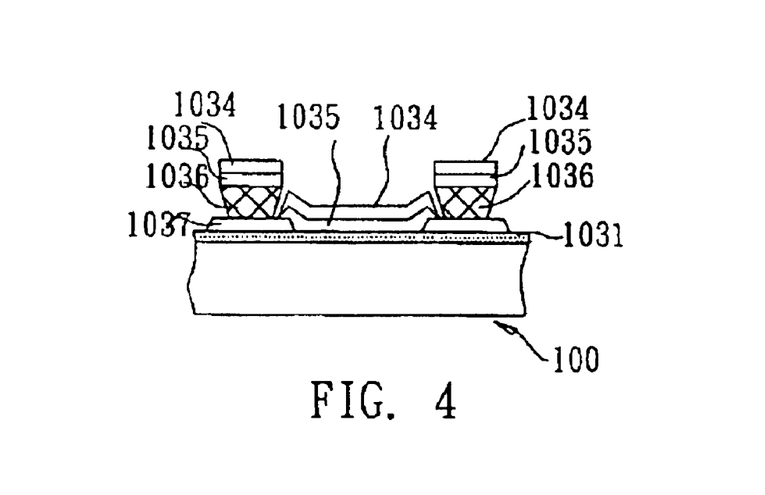
FIG. 4 is a cross sectional view of the active area of the OELD of the first embodiment of the present invention.
Figure 5:
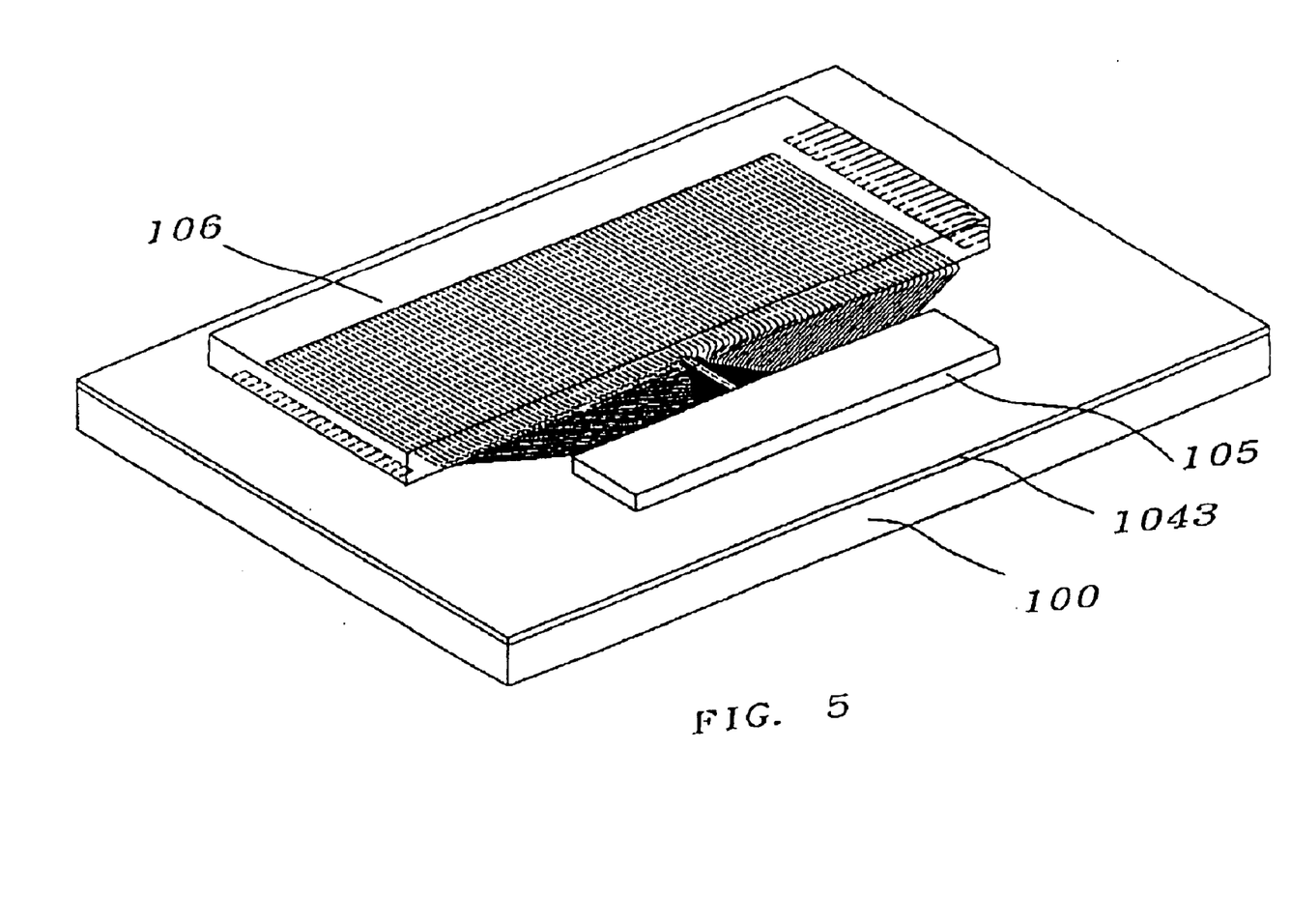
FIG. 5 is a perspective view of the OEL display device of the first embodiment of the present invention.

Both of the first conducting lines 1011 and the second conducting lines 1021 connect to the second electrodes 1034 (i.e. the cathode) in the active area 103. In the present embodiment, the second electrodes 1034 (i.e. the cathode) are made of aluminum. A sealing layer 1032 surrounds the active area 103 and makes the substrate bond tightly with the upper cover 106, as shown in FIG. 5. The space surrounded by the upper cover 106, the sealing layer 1032, and the substrate is filled with an inert gas. In the present embodiment, the inert gas is nitrogen. Hence, the active area 103 is sandwiched by the first conducting area 101 and the second conducting area 102. This relative arrangement of the active area, and the conducting areas makes the arrangement of the layout on the substrate flexible and lowers down the cost in mass production of display panels. The pixels in the active area 103, as shown in the cross sectional view of FIG. 4, are made of the second electrodes 1034 (the cathodes), the first electrodes 1031 (the anodes), and the organic electroluminescent medium 1035. The organic electroluminescent medium 1035 is sandwiched between the first electrode 1031 (the anodes) and the second electrode 1034 (the cathodes). The display driving mechanism of the active area of the organic electroluminescent display device of the present invention cam be any conventional display driving mechanism. In the present embodiment, the first electrode 1031 (the anodes) and the second electrode 1034 (the cathodes) are passively driven. On the other hand, the first electrodes 1031 do not connect directly to the second electrodes 1034. Each of the second electrodes 1034 connects to one of the first conducting lines 1011 or one of the second conducting lines 1021. Optionally, a plurality of stripes of photoresist isolating wall 1036 is formed on the first electrodes 1031 in the active area 103 of the substrate 100. Basically, the stripes of photoresist isolating wall 1036 are located between the adjacent second electrodes 1034 (the cathodes) and intersect the stripes of the first electrodes 1031 (the anodes) in the active area 103.

Each of the first conducting lines 1011, the second conducting lines 1021, and the connecting wires 104 has a transparent electrical conducting layer and an auxiliary metal layer that covers the transparent electrical conducting layer. The materials of the transparent electrical conducting layer can be any conventional transparent electrical conducting materials, such as $InSnO_3$, $SnO_2$, ZnO-doped $In_2O_3$, CdSnO or antimony. On the other hand, the auxiliary metal layers of the present invention can be any conductive material. In the present embodiment, the auxiliary metal layers of the first conducting lines 1011, the second conducting lines 1021, and the connecting wires 104 are made of silver alloy.

Figure 2:
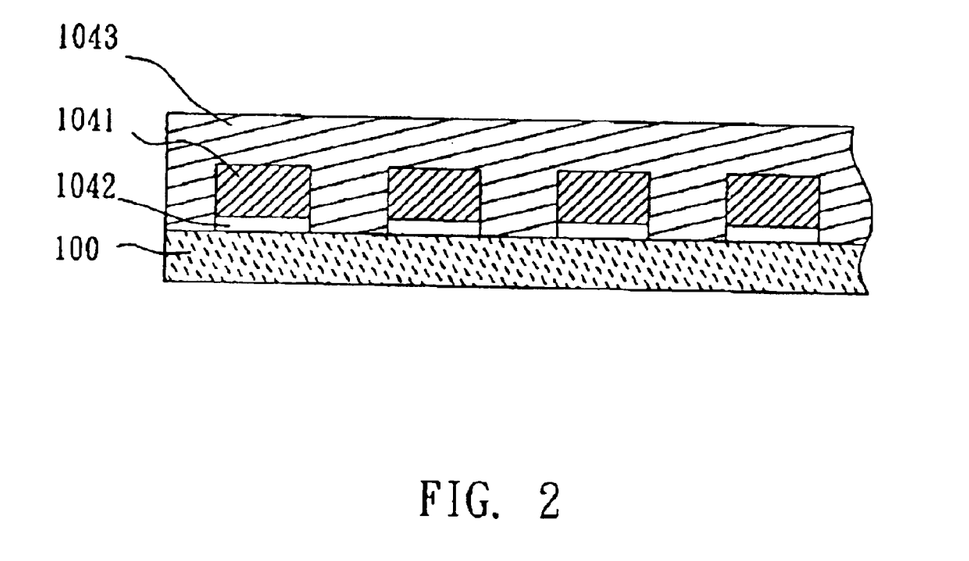
FIG. 2 is a cross sectional view of part of the panel of the OELD showing the structure of the conducting lines and the connecting wires of the first embodiment of the present invention.
Figure 3A:
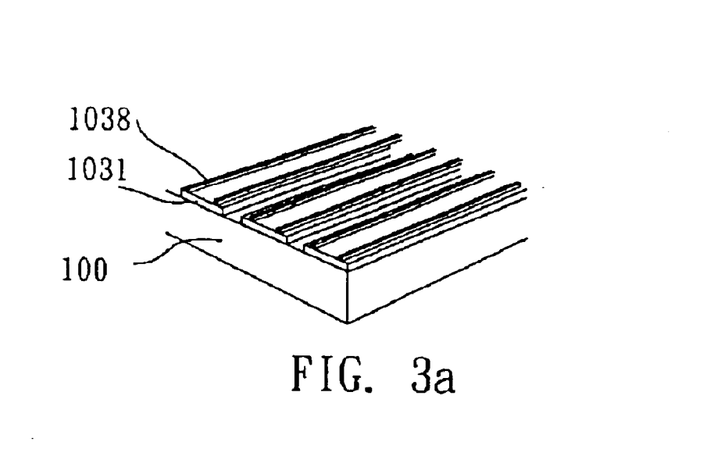
FIGS. 3*a*–3*c* are flow charts showing the manufacturing method of the active area of the first preferred embodiment of the present invention.
Figure 3B:
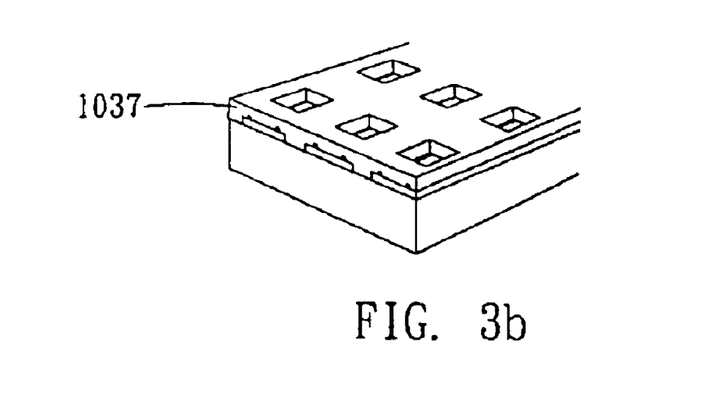
Figure 3C:
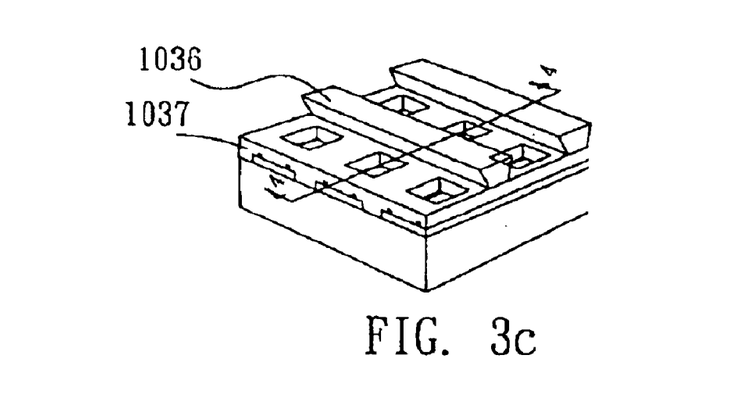

The method for manufacturing an organic electroluminescent display device of the present embodiment can be carried out through exposure, developing and etching a cleaned glass substrate coated with silver alloy and ITO, wherein ITO is sandwiched between the glass substrate and the silver alloy layer. Then, the patterns of the anodes in the active area, the first conducting lines in the first conducting area, the second conducting lines in the second area, and the pattern of the connecting wires are formed altogether through the etching of the silver alloy and ITO. The etchants used can be any conventional etchants for ITO or silver alloy. As shown in FIGS. 3a to 3c, stripes of ITO anodes and stripes of auxiliary electrodes 1038 made of silver alloy are formed on the substrate through the process illustrated above. Generally, the width of the stripes of auxiliary electrodes 1038 is less than that of the ITO anode 1031. Other components such as the first conducting lines 1011 in the first conducting area 101, the second conducting lines 1021 in the second conducting area 102, and the connecting wires 104 are composed of the ITO layer 1042 and the silver alloy layer 1041 (as shown in FIG. 2). An $SiO_2$ insulating layer 1043 is subsequently filled over the first conducting lines 1011 in the first conducting area 101, the second conducting lines 1021 in the second conducting area 102, and the connecting wires 104 outside the active area 103 through chemical evaporation or sputtering. The $SiO_2$ insulating layer 1043 may be formed after the conducting lines are completely formed by considering the convenience of the process flow. After the insulating layer 1043 is formed, the subsequent steps for constructing the electroluminescent mechanism are proceeded.

Then a positive chemically amplified photoresist composition is spin-coated on the substrate to form a photoresist layer with a uniform thickness. Afterwards, The substrate coated with the photoresist layer is prebaked in an oven, and then exposed to light through a mask having a pattern of stripes thereon. Next, the substrate is proceeded through the post exposure baking. At the same time, a surface treatment is also carried out by developing the photoresist to the patterned isolating walls 1036 in an atmosphere of tetramethyl ammonium hydroxide. After being developed, the parallel photoresist isolating walls 1036 in a shape of a stripe are formed perpendicularly to the parallel the stripes of ITO electrodes. The cross section of the parallel photoresist isolating walls 1036 has a T shape overhanging portion at top, which has a thickness of 0.8 μm. The line width of the photoresist isolating walls 1036 is 0.18 μm. Afterwards, the photoresist isolating walls 1036 with a T-top overhanging portion act as a shading mask when a TPD (N,N'-diphenyl-N,N'-bis(3-methylphenyl)-1,1'-biphenyl-4,4'-diamine) layer with a thickness of 700 Å is deposited in the gaps between the parallel photoresist isolating walls 1036 through evaporation. Next, an Alq$_3$ layer with a thickness of 500 Å is deposited by evaporation on the substrate to form the organic electroluminescent medium 1035. Finally, an aluminum layer with a thickness of 1000 Å is deposited by evaporation on the substrate to form the cathode electrodes 1034.

After the sealing layer 1032 is formed, the upper cover 106 is mounted on the active area 103 in an atmosphere of inert gas (e.g. nitrogen), which completes the manufacturing and the packaging of the electroluminescent display device.

Embodiment 2

The method for manufacturing and packaging an organic electroluminescent display device of the present embodiment is very similar to that illustrated in Embodiment 1, except that a polyimide insulating layer is coated on the first conducting lines in the first conducting area, the second conducting lines in the second conducting area, and the connecting wires outside of the active area on the substrate. The insulating layer is prebaked, exposed, and post exposure baked further. The electorluminescent display device of the present embodiment covers the auxiliary metal layers of the conducting lines and the connecting wires outside the sealing layer with an insulating layer so that the damage to the conducting lines caused by the environmental moisture and oxygen can be prevented or avoided. The burnout or short circuit occurring in the conducting lines is therefore reduced, the display quality is improved, the lifetime of the OLED device can be extended, the production yield of display panel is increased, and the lost in production cost of bad panels is lowered. Besides, it is easy to form an insulating layer on the OLED device to protect the auxiliary metal layers of the conducting lines and the connecting wires. Furthermore, the manufacturing process can be facilitated, the number of the application of photo-mask is reduced, the production cost is lowered, and the production time is shortened.

Embodiment 3

The method for manufacturing and packaging an organic electroluminescent display device of the present embodiment is similar to that illustrated in Embodiment 1, except that each of the first conducting lines 1011, the second conducting lines 1021, and the connecting wires 104 outside the sealing layer has only a transparent electrical conducting layer. In the present embodiment, the first conducting lines 1011, the second conducting lines 1021, and the connecting wires 104 are made of indium tin oxide (ITO). On the other hand, the first conducting lines 1011, the second conducting lines 1021, and the connecting wires 104 inside the sealing layer (i.e. in the active area) are made of transparent electrical conducting layer and optionally an auxiliary metal layer (e.g. a silver alloy layer).

Figure 6:
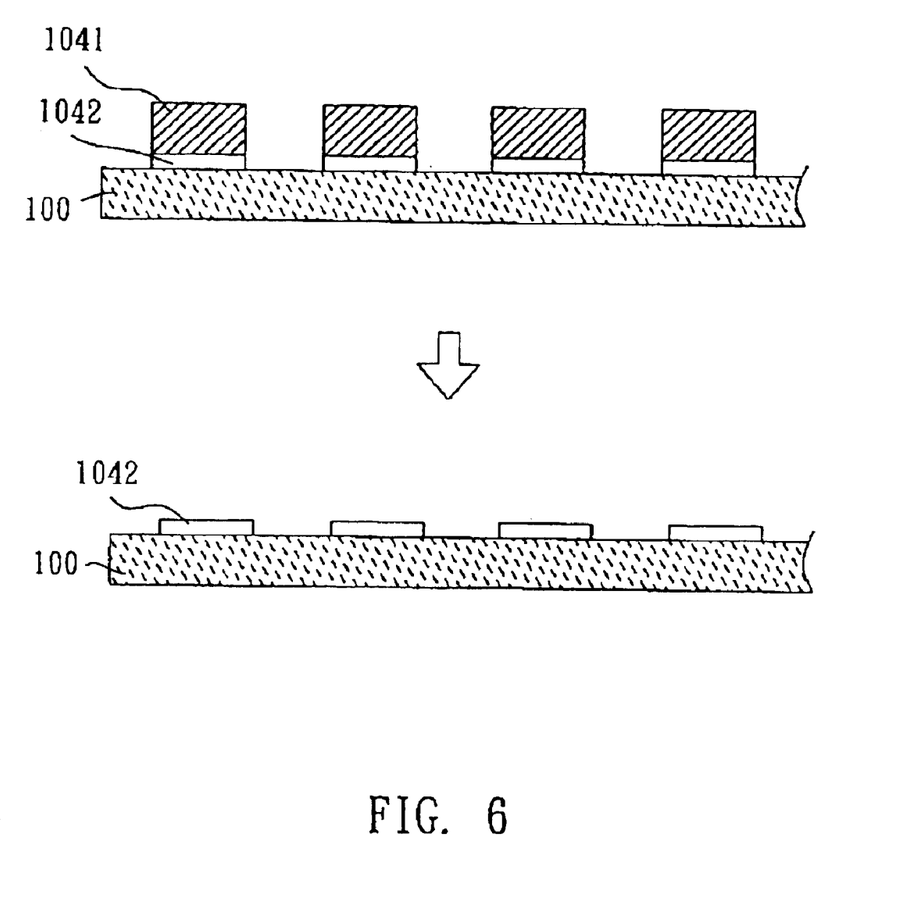
FIG. 6 is a cross sectional view of part of the panel of the OELD showing the structure of the conducting lines and the connecting wires of the third embodiment of the present invention.

The method for manufacturing an organic electroluminescent display device of the present embodiment can be carried out through exposure, developing and etching a cleaned glass substrate coated with silver alloy and ITO, wherein ITO is sandwiched between the glass substrate 100 and the silver alloy layer. Then, the patterns of the anodes in the active area 103, the first conducting lines 1011 in the first conducting area 101, the second conducting lines 1021 in the second area 102, and the pattern of the connecting wires 104 are formed altogether through the etching of the silver alloy and ITO. The etchants used can be any conventional etchants for ITO or silver alloy. As shown in FIGS. 3a to 3c, stripes of ITO anodes and stripes of auxiliary electrodes 1038 made of silver alloy are formed on the substrate through the process illustrated above. Generally, the width of the stripes of auxiliary electrodes 1038 is less than that of the ITO anode 1031. Other components such as the first conducting lines 1011 in the first conducting area 101, the second conducting lines 1021 in the second conducting area 102, and the connecting wires 104 are composed of the ITO layer 1042 (as shown in FIG. 6). At the same time, the auxiliary metal layers 1041 outside the active area have been striped and clearly removed by an etchant for silver alloy. In other words, there is no auxiliary metal layer on the transparent electrical conducting layer outside the active area sealed by the sealing layer. Afterwards, the pixel-defining layer 1037 made of polyimide is formed on the ITO anodes through photolithography and curing at 350° C. A panel for an organic electroluminescence of the present invention is made and ready for further manufacturing process.

Then a positive chemically amplified photoresist composition is spin-coated on the glass substrate to form a photoresist layer with a uniform thickness. Afterwards, The substrate coated with the photoresist layer is prebaked in an oven, and then exposed to light through a mask having a pattern of stripes thereon. Next, the substrate is proceeded through the post exposure baking. At the same time, a surface treatment is also carried out by developing the photoresist to the patterned isolating walls 1036 in an atmosphere of tetramethyl ammonium hydroxide. After being developed, the parallel photoresist isolating walls 1036 in a shape of a stripe are formed perpendicularly to the parallel stripes of the first electrodes 1031 made of ITO. The cross section of the parallel photoresist isolating walls 1036 has a T shape overhanging portion at top, which has a thickness of 0.8 μm. The line width of the photoresist isolating walls 1036 is 0.18 μm. Afterwards, the photoresist isolating walls 1036 with a T-top overhanging portion act as a shading mask when a TPD (N,N'-diphenyl-N,N'-bis(3-methylphenyl)-1,1'-biphenyl-4,4'-diamine) layer with a thickness of 700 Å is deposited in the gaps between the parallel photoresist isolating walls 1036 through evaporation. Next, an Alq$_3$ layer with a thickness of 500 Å is deposited by evaporation on the substrate to form the organic electroluminescent medium 1035. Finally, an aluminum layer with a thickness of 1000 Å is deposited by evaporation on the substrate to form the cathode electrodes 1034.

After the sealing layer 1032 is formed, the upper cover 106 is mounted on the active area 103 (as shown in FIG. 5) in an atmosphere of inert gas (e.g. nitrogen), and the manufacturing and the packaging of the electroluminescent display device is completed.

The damage to the conducting lines caused by the environmental moisture and oxygen can be prevented or avoided by striping or peeling off the auxiliary metal layers of the first conducting lines, the second conducting lines, and the connecting wires outside the sealing layer. The burnout or short circuit occurring in the conducting lines is therefore reduced, the display quality is improved, the lifetime of the OLED device can be extended, the production yield of display panel is increased, and the lost in production cost of bad panels is lowered. Besides, the peeling of the auxiliary metal layers of the first conducting lines, the second conducting lines, and the connecting wires outside the sealing layer can be carried out as the circuits is formed. Furthermore, the manufacturing process can be facilitated, the number of the application of photo-mask is reduced, the production cost is lowered, and the production time is shortened.

Although the present invention has been explained in relation to its preferred embodiment, it is to be understood that many other possible modifications and variations can be made without departing from the spirit and scope of the invention as hereinafter claimed.

What is claimed is:

1. An organic electroluminescent display device, comprising:
    a substrate having a first conducting area, a second conducting area, and an active area; wherein said active area locates adjacent to said first conducting area and said second conducting area;
    a plurality of connecting wires, which do not connect with each other and are located outside said active area on said substrate;
    a plurality of stripes of first electrodes located in said active area, wherein said first electrodes connect to said connecting wires;
    a plurality of first conducting lines, which do not connect with each other and are located in said first conducting area on said substrate;
    a plurality of second conducting lines, which do not connect with each other and are located in said second conducting area on said substrate;
    a plurality of second electrodes located in said active area, wherein each of said second electrodes connects a first conducting line or a second conducting line;
    at least one organic electroluminescent medium located in said active area, wherein said organic electroluminescent medium is sandwiched between said first electrode and said second electrode;
    an upper cover mounted over or on said active area of said substrate for covering said active area;
    a sealing layer sandwiched between said upper cover and said substrate for sealing, surrounding said active area, and isolating said active area from air or moisture; and
    an insulating layer filled over said first conducting lines, said second conducting lines, and said connecting wires for isolating said first conducting lines, said second conducting lines, and said connecting wires from air or moisture;
    wherein part of each first electrodes, each first conducting lines, each second conducting lines, and each connecting wires has at least one auxiliary metal layer and one transparent electrical conducting layer, and said transparent electrical conducting layer is sandwiched between said auxiliary metal layer and said substrate.

2. The organic electroluminescent display device as claimed in claim 1, wherein said insulating layer is made of $SiO_2$, $TiO_2$, or silicon nitride.

3. The organic electroluminescent display device as claimed in claim 1, wherein said insulating layer is made of epoxy resin, unsaturated polyester resin, Teflon™ resin, phenolic resin, or polyimide.

4. The organic electroluminescent display device as claimed in claim 1, wherein said first conducting lines, said second conducting lines, and said connecting wires located outside said transparent electrical conducting layer do not have said auxiliary metal layer.

5. The organic electroluminescent display device as claimed in claim 1, wherein said active area is located between said first conducting lines and said second conducting lines.

6. The organic electroluminescent display device as claimed in claim 1, wherein said auxiliary metal layers of said first electrodes, said first conducting lines, and said second conducting lines are made of aluminum, chromium, silver-copper alloy, or silver alloy.

7. The organic electroluminescent display device as claimed in claim 1, further comprising a plurality of isolating walls, which lies in between said second electrodes in said active area or selectively on said first electrodes.

8. The organic electroluminescent display device as claimed in claim 1, further comprising a plurality of pixel-defining layers for insulating and defining each pixel-area of organic electroluminescent media, wherein each of said pixel-defining layers is located on or between said adjacent organic electroluminescent media on said substrate or said first electrodes.

9. The organic electroluminescent display device as claimed in claim 8, wherein said pixel-defining layer is made of polyimide.

10. The organic electroluminescent display device as claimed in claim 1 further comprising at least one auxiliary electrode located on the surface of or embedded in said first electrodes or said second electrodes, wherein said auxiliary electrode located in said active area is made of aluminum, chromium, or silver alloy.

11. The organic electroluminescent display device as claimed in claim 1, wherein said transparent electrical conducting layer is made of $InSnO_3$, $SnO_2$, ZnO-doped $In_2O_3$, CdSnO or antimony.

12. The display device as claimed in claim 1, wherein said second electrodes are made of aluminum, diamond, diamond like carbon (DLC), calcium, copper-silver alloy, or magnesium-silver alloy.

13. The display device as claimed in claim 1, wherein said first electrodes are parallel to each other.

14. The display device as claimed in claim 1, wherein said second electrodes are parallel to each other.

15. An organic electroluminescent display device, comprising:
    a substrate having a first conducting area, a second conducting area, and an active area; wherein said active area locates adjacent to said first conducting area and said second conducting area;
    a plurality of connecting wires located outside said active area on said substrate, wherein said connecting wires do not connect with each other;
    a plurality of stripes of first electrodes located in said active area, wherein said first electrodes connect to said connecting wires;
    a plurality of first conducting lines located in said first conducting area on said substrate and do not connect with each other;
    a plurality of second conducting lines located in said second conducting area on said substrate and do not connect with each other;
    an upper cover mounted over or on said active area of said substrate for covering said active area; and
    a sealing layer sandwiched between said upper cover and said substrate for sealing, surrounding said active area, and isolating said active area from air or moisture;
    wherein each first conducting line, each second conducting line, and each connecting wire in said active area has at least one transparent electrical conducting layer and optionally an auxiliary metal layer, said transparent electrical conducting layer is sandwiched between said auxiliary metal layer and said substrate; and no auxiliary metal layer exists in each first conducting lines, each second conducting lines, and each connecting wires outside said active area.

16. The organic electroluminescent display device as claimed in claim 15, further comprising, an insulating layer filled over said first conducting lines, said second conducting lines, and said connecting wires for isolating said first conducting lines, said second conducting lines, and said connecting wires from air or moisture.

17. The organic electroluminescent display device as claimed in claim 15, wherein part of said first electrodes located between said sealing layer and said active area, part of said first conducting lines, part of said second conducting lines, and part of said connecting wires have a transparent conducting layer and optionally have at least one auxiliary metal layer.

18. The organic electroluminescent display device as claimed in claim 15, wherein said active area is located between said first conducting area and said second conducting area.

19. The organic electroluminescent display device as claimed in claim 15, wherein said transparent electrical conducting layer is made of $InSnO_3$, $SnO_2$, ZnO-doped $In_2O_3$, CdSnO or antimony.

20. The organic electroluminescent display device as claimed in claim 15, wherein said second electrodes are made of aluminum, diamond, diamond like carbon (DLC), calcium, copper-silver alloy, aluminum-silver alloy, or magnesium-silver alloy.

* * * * *